(12) United States Patent
Teo

(10) Patent No.: US 7,652,515 B1
(45) Date of Patent: Jan. 26, 2010

(54) CLOCK SIGNAL CONVERSION SYSTEM

(75) Inventor: Swee-Ann Teo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1108 days.

(21) Appl. No.: 10/793,359

(22) Filed: Mar. 4, 2004

(51) Int. Cl.
*H03K 3/00* (2006.01)

(52) U.S. Cl. .................................... 327/291; 327/108

(58) Field of Classification Search ............ None
See application file for complete search history.

(56) References Cited

U.S. PATENT DOCUMENTS

| | | | |
|---|---|---|---|
| 5,428,312 A * | 6/1995 | Higeta et al. ............ 327/333 |
| 6,130,556 A * | 10/2000 | Schmitt et al. ............ 326/81 |
| 6,573,764 B1 * | 6/2003 | Taylor .................... 327/108 |
| 6,859,074 B2 * | 2/2005 | Ajit ........................ 327/108 |
| 6,937,078 B2 * | 8/2005 | Schrodinger ............ 327/165 |
| 6,940,331 B2 * | 9/2005 | Kim ........................ 327/270 |

OTHER PUBLICATIONS

"*Part 16: Air Interface For Fixed Broadband Wireless Access Systems*", IEEE 802.16, IEEE Standard For Local And Metropolitan Area Networks, Oct. 1, 2004.

* cited by examiner

*Primary Examiner*—Lincoln Donovan
*Assistant Examiner*—Khareem E. Almo

(57) ABSTRACT

Apparatus, systems, and methods implementing techniques for converting clock signals are described. A voltage-based input clock signal is received and converted into a current-based clock signal. An electrical current of the current-based clock signal is varied in response to the input clock signal while a voltage of the current-based clock signal remains substantially constant.

71 Claims, 4 Drawing Sheets

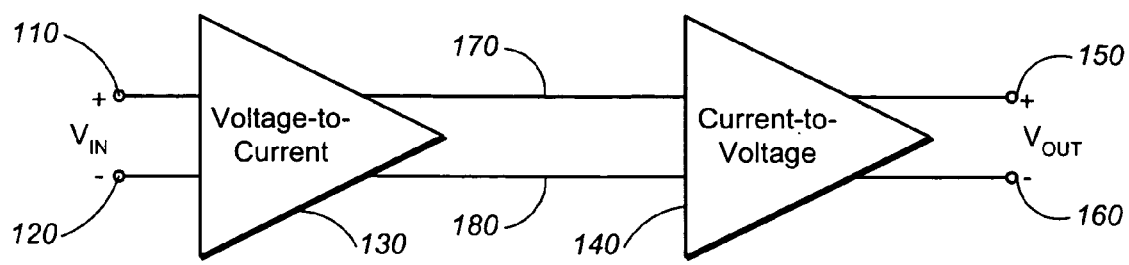
FIG._1
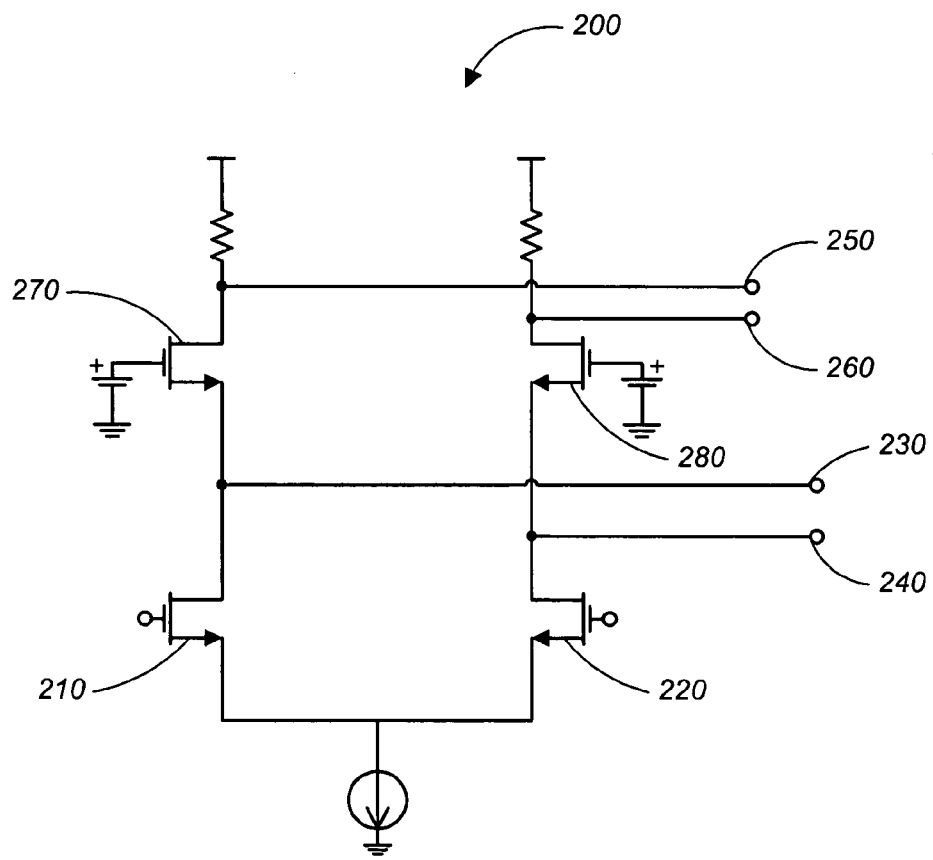
FIG._2A

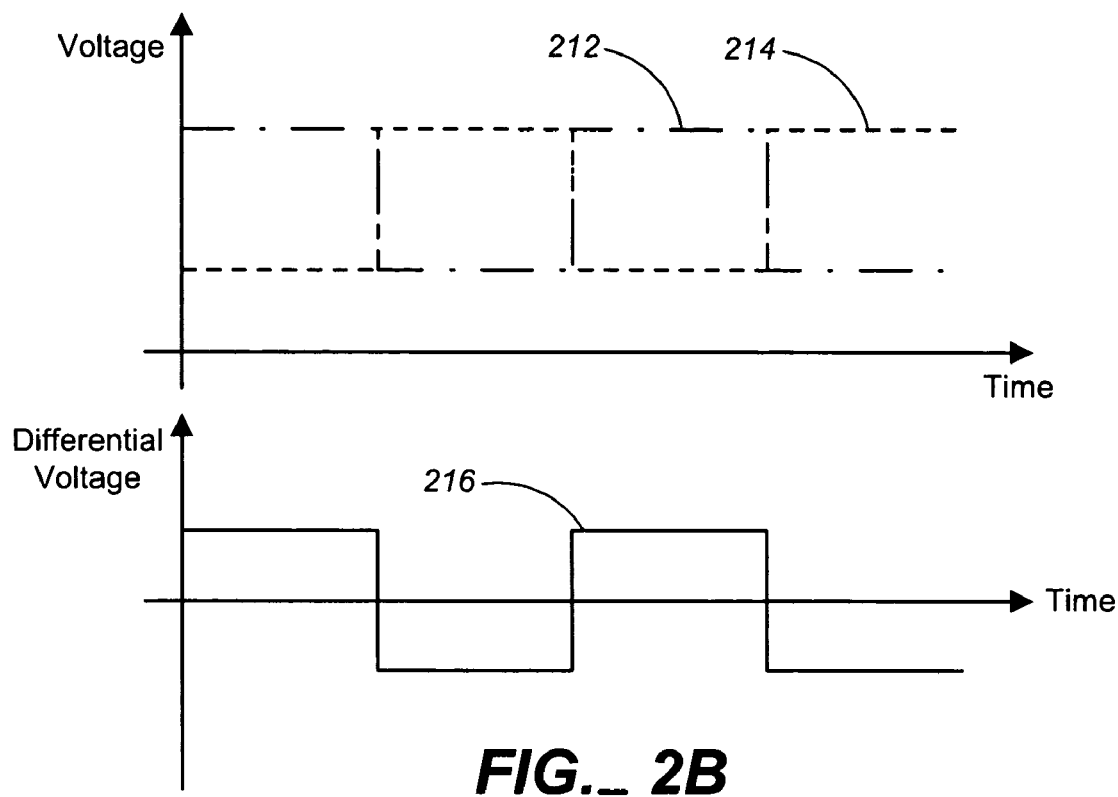
FIG._ 2B
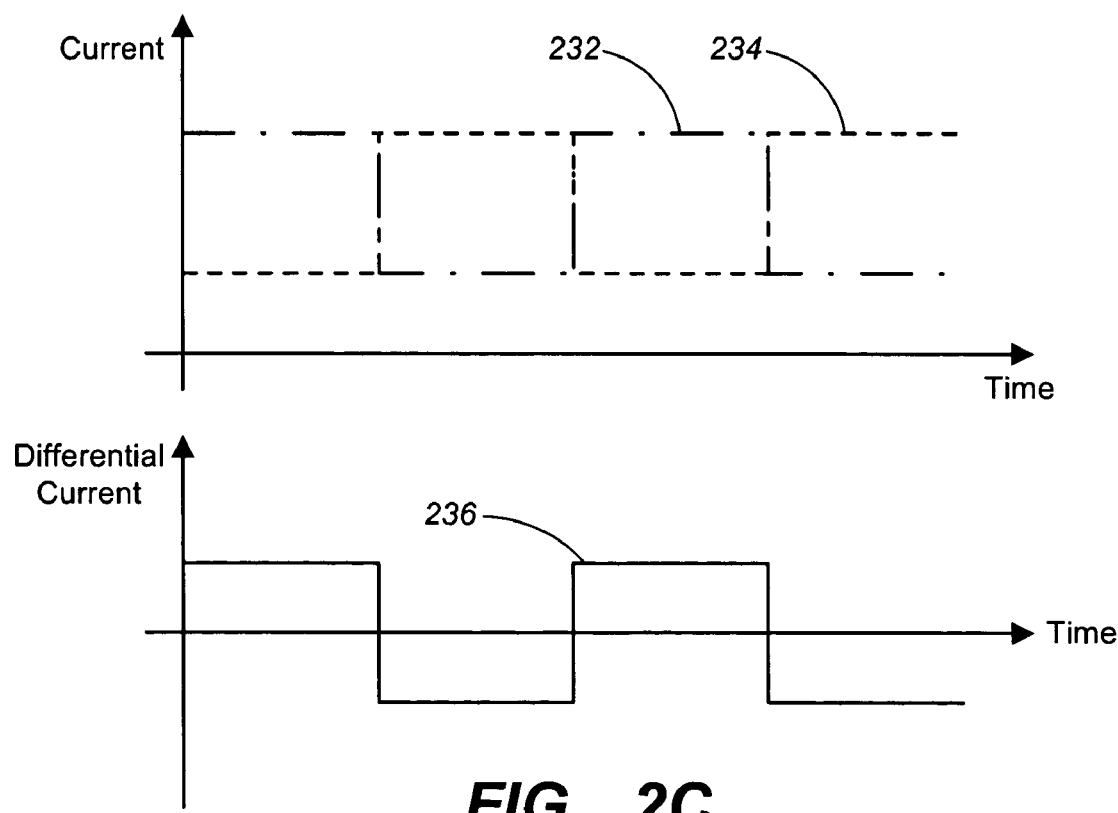
FIG._ 2C

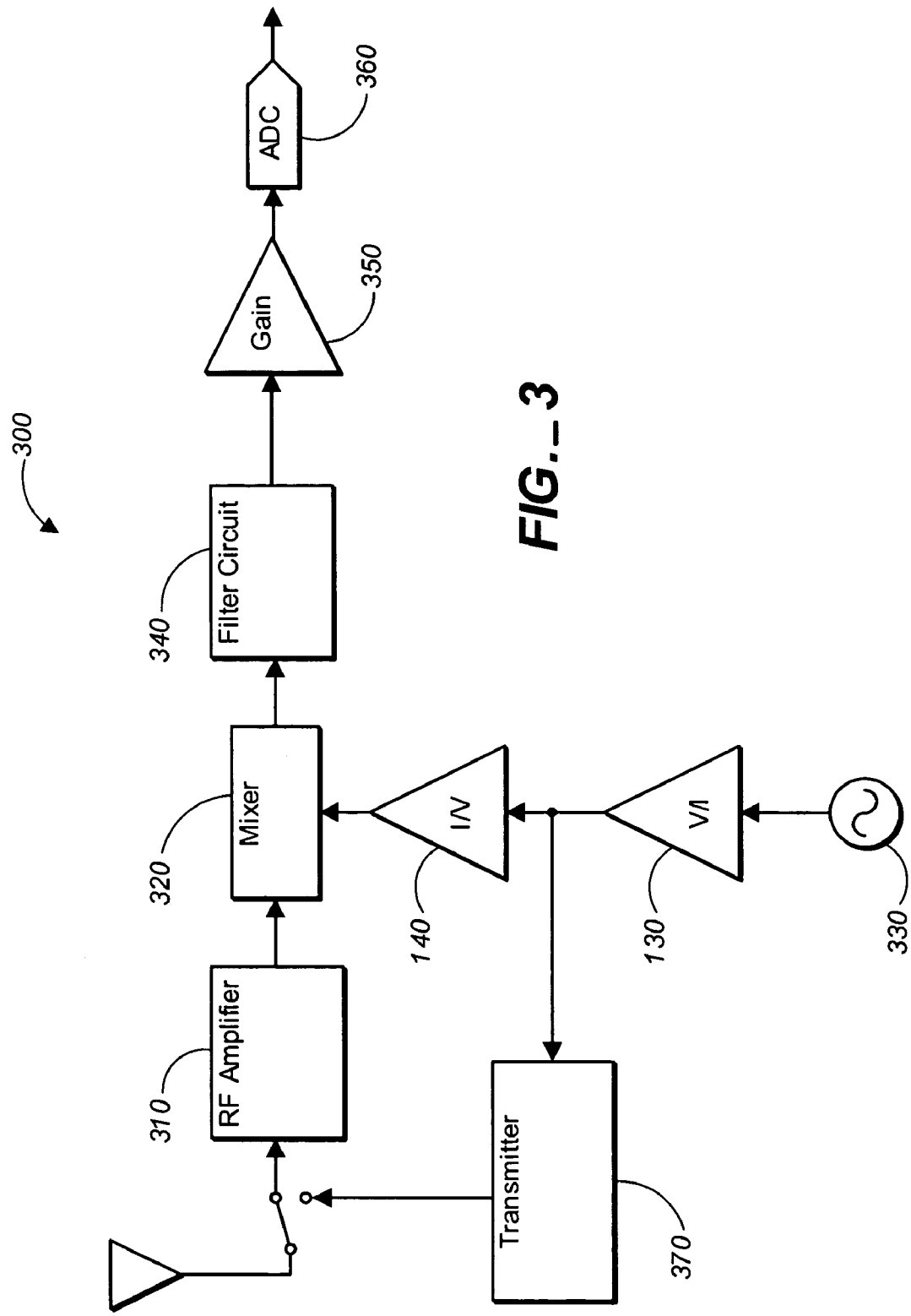
FIG._3

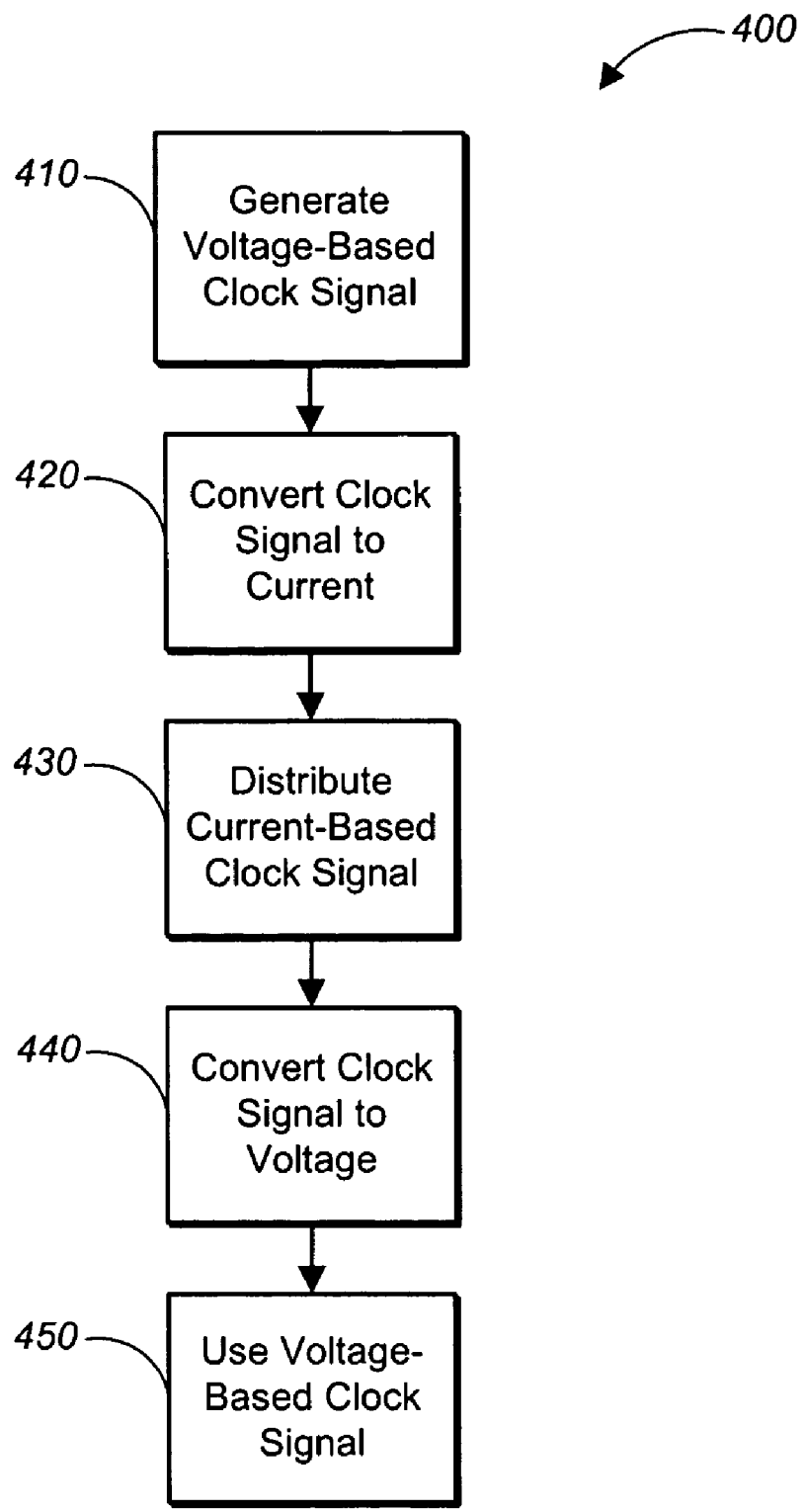
FIG._4

CLOCK SIGNAL CONVERSION SYSTEM

BACKGROUND

The following disclosure relates to electrical circuits and signal processing.

Digital circuits can use a central clock whose signal is distributed to multiple circuit components and allows the circuit components to operate synchronously. The clock signal is typically generated by an oscillator circuit, for example, a quartz crystal or RC oscillator circuit. In a wireless communications circuit (which may include analog and/or digital components), a clock signal from a local oscillator can be used to mix signals up to intermediate frequency (IF) and radio frequency (RF) bands.

Clock signals are conventionally distributed as voltages. A conventional clock signal typically alternates between a low voltage and a high voltage. A quick transition between the low voltage and the high voltage, which results in a sharp clock edge, is typically desirable. The frequency of the transitions between voltages determines the clock frequency.

In large integrated circuits, between integrated circuit chips, or in communications systems, the conduits along which a clock signal is transmitted can be long. A conduit typically has a parasitic capacitance that increases with the length of the conduit. The parasitic capacitance on long clock distribution conduits can be significant at the frequencies at which a modern clock can operate. As clock frequencies rise, detrimental effects of parasitic capacitance typically become more severe. The parasitic capacitance typically requires power to charge and discharge as the voltage on the conduit varies, thereby increasing the power used by a circuit. Charging and discharging the parasitic capacitance on a conventional clock distribution conduit typically slows the transition of the clock signal between the low voltage and the high voltage, resulting in a lower-quality clock signal. Voltage swings on a long conduit can capacitively couple to parts of a circuit to which the conduit is not connected, thereby introducing noise into the circuit from a clock signal on a conduit and into the clock signal from the circuit.

To mitigate the increased power consumption caused by parasitic capacitance and to sharpen clock edges, inductance can be added to a conventional clock distribution circuit. The amount of added inductance can be chosen so that the inductance in the conventional clock distribution circuit resonates with the parasitic capacitance at the clock frequency. When the inductance and the parasitic capacitance resonate, a high impedance is presented between the conduit and ground, reducing the power loss through the parasitic capacitance and sharpening the clock edge.

Monolithic inductors typically require a significant amount of area on an integrated-circuit chip. In addition, when process variations affect the amount of inductance or parasitic capacitance in a conventional clock distribution circuit, the resonant frequency of the inductance and parasitic capacitance can shift away from the clock frequency, degrading the clock signal and increasing power loss. The introduction of inductance into the clock distribution circuit typically decreases the bandwidth of the clock signal.

SUMMARY

In one aspect, the invention features an apparatus for converting clock signals. A driver circuit receives a voltage-based input clock signal and converts the input clock signal into a current-based clock signal. The driver circuit varies an electrical current of the current-based clock signal in response to the input clock signal while keeping a voltage of the current-based clock signal substantially constant.

In another aspect, the invention features an apparatus for converting clock signals. A driving means receives a voltage-based input clock signal and converts the input clock signal into a current-based clock signal. The driving means varies an electrical current of the current-based clock signal in response to the input clock signal while keeping a voltage of the current-based clock signal substantially constant.

In one aspect, the invention features a wireless transceiver that includes a communications receiver, which receives a modulated carrier signal. The communications receiver includes a clock signal conversion circuit, which includes a driver circuit that receives a voltage-based input clock signal and converts the input clock signal into a current-based clock signal. The driver circuit varies an electrical current of the current-based clock signal in response to the input clock signal while keeping a voltage of the current-based clock signal substantially constant.

In another aspect, the invention features a wireless transceiver that includes a receiving means for receiving a modulated carrier signal. The receiving means includes a clock signal conversion circuit, which includes a driving means for receiving a voltage-based input clock signal and converting the input clock signal into a current-based clock signal. The driving means varies an electrical current of the current-based clock signal in response to the input clock signal while keeping a voltage of the current-based clock signal substantially constant.

In yet another aspect, the invention features a method for processing a clock signal. A voltage-based input clock signal is received and converted into a current-based clock signal. An electrical current of the current-based clock signal varies substantially in response to the input clock signal, and the current-based clock signal has substantially no voltage variation.

Particular implementations may include one or more of the following features. The driver circuit can receive the input clock signal from an oscillator. A frequency of the current-based clock signal can be different than a frequency of the input clock signal. The driver circuit can convert the input clock signal into a differential current-based clock signal. The driver circuit can include an input section including at least one input transistor and a conversion section including at least one conversion transistor.

A receiver circuit can receive the current-based clock signal and convert the current-based clock signal into a voltage-based output clock signal. A mixer can mix the voltage-based output clock signal with an information signal. A digital circuit that performs a synchronous operation can be driven with the voltage-based output clock signal. The driver circuit can be included on a first integrated circuit, and the receiver circuit can be included on a second integrated circuit.

An intermediate circuit can be connected between the driver circuit and the receiver circuit, and the intermediate circuit can transform the current-based clock signal. The intermediate circuit can filter a spurious signal included in the current-based clock signal or the intermediate circuit can amplify the current-based clock signal. The driver circuit can be connected to a plurality of receiver circuits. An input impedance of the receiver circuit can be low relative to an impedance of a conduit coupling the driver circuit to the receiver circuit.

Implementations can include one or more of the following advantages. A method, apparatus, and system are disclosed that can be used to distribute a clock signal on a conduit with substantially no voltage swing. The method, apparatus, and system can reduce capacitive coupling between the clock distribution conduit and other parts of a circuit. The method, apparatus, and system can reduce power usage in a clock distribution circuit, sharpen clock edges, and increase clock signal bandwidth. On-chip area used by the clock distribution circuit can be reduced.

These general and specific aspects may be implemented using an apparatus, a system, a method, or any combination of apparatus, systems, and methods.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a block diagram of a current-based clock distribution system.

FIG. 2A is a circuit for converting between a voltage signal and a current signal.

FIG. 2B shows a differential voltage waveform.

FIG. 2C shows a differential current waveform.

FIG. 3 is a block diagram of a wireless transceiver.

FIG. 4 is a flowchart of a process for current-based clock distribution.

Like reference numbers and designations in the various drawings indicate like elements.

DETAILED DESCRIPTION

FIG. 1 shows a block diagram of a clock distribution system that distributes a clock signal as a differential current along a conduit 170 and a conduit 180. A voltage-based clock signal in the form of a differential voltage is applied to a voltage-to-current converter 130 between an input terminal 110 and an input terminal 120. Voltage-to-current converter 130 converts the voltage-based clock signal to a corresponding current-based clock signal and applies the current-based clock signal differentially between conduits 170 and 180. In other implementations, the voltage-based and/or current-based clock signals may be single ended instead of differential. When the input impedance of current-to-voltage converter 140 is low relative to the impedance of any parasitic capacitance on conduits 170 and 180, the voltages of the clock signal on conduits 170 and 180 do not vary substantially as the currents of the clock signal in conduits 170 and 180 are varied substantially; the clock signal transmitted on conduits 170 and 180 is current-based. Since the voltages of conduits 170 and 180 do not vary substantially, the parasitic capacitance of conduits 170 and 180 does not charge or discharge substantially, resulting in little power loss due to the parasitic capacitance.

Voltage-to-current converter 130 can be any circuit that takes a voltage-based clock signal as an input and outputs a corresponding current-based clock signal. The output signal can be at a same frequency as the input signal, or the frequency of the output signal can be a multiple or a fraction of the frequency of the input signal. The output signal can also have a non-linear relationship with the input signal, for example, an exponential or squared relationship.

The current-based clock signal on conduits 170 and 180 is applied differentially to current-to-voltage converter 140 to produce a differential output voltage between an output terminal 150 and an output terminal 160. Current-to-voltage converter 140 can be any circuit that takes a current-based clock signal as an input and outputs a corresponding voltage-based clock signal. When current-to-voltage converter 140 has a low input impedance, the voltage on conduits 170 and 180 is substantially constant, reducing the effects of the parasitic capacitance on conduits 170 and 180. Like voltage-to-current converter 130, the relationship of the input frequency of current-to-voltage converter 140 to the output frequency of current-to-voltage converter 140 can be linear or nonlinear, and the input signal and/or output signal can be single ended instead of differential.

In some implementations, voltage-to-current converter 130 is connected to several current-to-voltage converters. In other implementations, other circuits may be connected to conduits 170 and 180, either in parallel or in series with current-to-voltage converter 140. Other circuits connected to conduits 170 and 180 have impedance characteristics that keep the voltage on conduits 170 and 180 substantially constant. The current-based clock signal may be modified by other circuits connected to conduits 170 and 180 between voltage-to-current converter 130 and current-to-voltage converter 140. For example, the current-based clock signal can be filtered, can be amplified, or can undergo a frequency change caused by a circuit connected to conduits 170 and 180.

FIG. 2A shows an implementation of a circuit 200 that can be used for voltage-to-current or current-to-voltage conversion. When circuit 200 is used as a voltage-to-current converter (e.g., voltage-to-current converter 130), a differential voltage-based input clock signal is applied between the gates of a transistor 210 and a transistor 220, and a differential current-based output clock signal is produced between a terminal 230 and a terminal 240. When circuit 200 is used as a voltage-to-current converter, the output impedance at terminals 230 and 240 is high because of the resistance between the sources and the drains of transistors 210 and 220. Transistors 210 and 220 can be designed to have a high resistance between source and drain so that the output impedance of the voltage-to-current converter is high.

Referring to FIG. 2A and FIG. 2B, the voltage-based input clock signal switches between a low differential voltage and a high differential voltage. When referenced to ground, the voltage input at transistor gate 210 swings between two voltages, yielding a waveform 212. The voltage input at transistor gate 220 swings between approximately the same two voltages approximately 180 degrees out of phase with waveform 212, yielding a waveform 214. When the input clock signal is referenced to one of the waveforms, for example waveform 212 at transistor gate 210, the other waveform appears to switch polarity from positive to negative, yielding a differential waveform 216.

Referring to FIG. 2A and FIG. 2C, the current-based output clock signal switches between a low differential current and a high differential current. The current output at terminal 230 swings between two currents, yielding a waveform 232. The current output at terminal 240 swings between two currents approximately 180 degrees out of phase with waveform 232, yielding a waveform 234. When the output clock signal is referenced to one of the waveforms, for example waveform 232 at terminal 230, the alternating-current (AC) current flow in terminal 240 appears to switch direction, yielding a differential waveform 236.

Referring again to FIG. 2A, when circuit 200 is used as a current-to-voltage converter (e.g., current-to-voltage converter 140), transistors 210 and 220 are biased with a DC bias voltage. A differential current-based input clock signal is applied between terminal 230 and terminal 240 and a differential voltage-based output clock signal is produced between a terminal 250 and a terminal 260. When circuit 200 is used as a current-to-voltage converter, the input resistance seen at terminals 230 and 240 is low because of the common-gate configuration of transistors 270 and 280.

A current-based clock distribution system can be used in a wide range of applications. Referring to FIG. 3, the current-based clock distribution system can be used in a wireless transceiver 300 (hereafter referred to as transceiver 300). The receive path of transceiver 300 includes an RF amplifier 310 for amplifying an RF input signal. A mixer 320 modulates the amplified RF input signal from the output of RF amplifier 310 with a clock signal generated by local oscillator 330 to create a baseband signal. The baseband signal is filtered by filter circuit 340 to attenuate undesired frequencies in the baseband signal. The filtered baseband signal is then amplified by gain stage 350 and is converted into a digital signal by an analog-to-digital converter 360. The transmit path of transceiver 300 is represented as a transmitter 370.

In transceiver 300, the clock signal from local oscillator 330 is distributed as a current. The voltage-based output clock signal of local oscillator 330 is converted to a current-based clock signal by voltage-to-current converter 130. The local oscillator clock signal is distributed as a current to current-to-voltage converter 140 and to transmitter 370. Transmitter 370 includes a separate current-to-voltage converter to convert the current-based local oscillator clock signal to a voltage-based clock signal. Transceiver 300 can be IEEE 802 compliant with the following standards: 802.11, 802.11a, 802.11b, 802.11e, 802.11g, 802.11h, 802.11i, 802.11n, and 802.16.

FIG. 4 shows a method 400 for distributing a current-based clock signal. A voltage-based clock signal is generated (step 410) and is converted to a current-based clock signal (step 420). The current-based clock signal is distributed (step 430). For example, the current-based clock signal can be distributed to several receivers. The current-based clock signal is converted (e.g., at a receiver) to a voltage-based clock signal (step 440), and the voltage-based clock signal is used (step 450).

Various implementations have been described. These and other implementations are within the scope of the following claims. For example, the described system and method can be used to distribute a current-based clock signal within a single integrated circuit or between separate integrated circuits.

What is claimed is:

1. An apparatus, comprising:
a driver circuit operable to receive a voltage-based input clock signal and convert the voltage-based input clock signal into a current-based clock signal, the driver circuit comprising a converter operable to substantially vary an electrical current of the current-based clock signal in response to the received voltage-based input clock signal while keeping a voltage of the current-based clock signal substantially constant.

2. The apparatus of claim 1, further comprising:
an oscillator operable to generate the voltage-based input clock signal,
wherein the driver circuit is operable to receive the voltage-based input clock signal from the oscillator.

3. The apparatus of claim 1, wherein:
a frequency of the current-based clock signal is different than a frequency of the voltage-based input clock signal.

4. The apparatus of claim 1, wherein:
the driver circuit is operable to convert the voltage-based input clock signal into a differential current-based clock signal.

5. The apparatus of claim 1, wherein:
the driver circuit includes,
an input section including at least one input transistor; and
wherein the converter includes at least one conversion transistor.

6. The apparatus of claim 1, further comprising:
a receiver circuit operable to receive the current-based clock signal and convert the current-based clock signal into a voltage-based output clock signal.

7. The apparatus of claim 6, further comprising:
a mixer operable to mix the voltage-based output clock signal with an information signal.

8. The apparatus of claim 6, further comprising:
a digital circuit configured to receive the voltage-based output clock signal, the digital circuit being operable to perform a synchronous operation.

9. The apparatus of claim 6, wherein:
the driver circuit is included on a first integrated circuit; and
the receiver circuit is included on a second integrated circuit.

10. The apparatus of claim 6, further comprising:
an intermediate circuit connected between the driver circuit and the receiver circuit operable to transform the current-based clock signal.

11. The apparatus of claim 10, wherein: the intermediate circuit is operable to filter a spurious signal included in the current-based clock signal.

12. The apparatus of claim 10, wherein: the intermediate circuit is operable to amplify the current-based clock signal.

13. The apparatus of claim 6, wherein:
the driver circuit is connected to a plurality of receiver circuits.

14. The apparatus of claim 1, wherein:
the converter is configured to apply the current-based clock signal to two or more electrical conduits such that an input impedance of the converter is low relative to an impedance associated with the electrical conduits.

15. An apparatus, comprising:
means for receiving a voltage-based input clock signal; and
means for converting the voltage-based input clock signal into a current-based clock signal, the means for converting substantially varying an electrical current of the current-based clock signal in response to the received voltage-based input clock signal while keeping a voltage of the current-based clock signal substantially constant.

16. The apparatus of claim 15, further comprising:
means for producing the voltage based input clock signal wherein the means for producing is coupled with the means for receiving the voltage-based input clock signal.

17. The apparatus of claim 15, wherein: a frequency of the current-based clock signal is different than a frequency of the voltage-based input clock signal.

18. The apparatus of claim 15, wherein: the means for converting converts the voltage-based input clock signal into a differential current-based clock signal.

19. The apparatus of claim 15, wherein:
the means for converting includes,
input means including at least one input transistor; and
conversion means including at least one conversion transistor.

20. The apparatus of claim 15, further comprising:
a receiver circuit comprising:
means for receiving the current-based clock signal and means for converting the current-based clock signal into a voltage-based output clock signal.

21. The apparatus of claim 20, wherein: further comprising:
means for mixing the voltage-based output clock signal with an information signal.

22. The apparatus of claim 20, wherein: further comprising:
    means for driving a digital circuit with the voltage-based output clock signal, the digital circuit being operable to perform a synchronous operation.

23. The apparatus of claim 20, wherein:
    the means for converting the voltage-based input clock signal is included on a first integrated circuit; and
    the receiver circuit is included on a second integrated circuit.

24. The apparatus of claim 20, further comprising:
    means for transforming the current-based clock signal, wherein the means for transforming is coupled between the means for converting the voltage-based input clock signal and the receiver circuit.

25. The apparatus of claim 24, wherein:
    the means for transforming filters a spurious signal included in the current-based clock signal.

26. The apparatus of claim 24, wherein:
    the means for transforming amplifies the current-based clock signal.

27. The apparatus of claim 20, wherein:
    the means for converting the voltage-based input clock signal is connected to a plurality of receiving circuits.

28. The apparatus of claim 20, wherein:
    an input impedance of the receiver circuit is low relative to an impedance of a conduit coupling the means for converting the voltage-based input clock signal to the receiver circuit.

29. A wireless transceiver, comprising:
    a communications receiver operable to receive a modulated carrier signal, the communications receiver including a clock signal conversion circuit,
    wherein the comprises a driver circuit operable to receive a voltage-based input clock signal and convert the voltage-based input clock signal into a current-based clock signal, the driver circuit comprising a converter operable to substantially vary an electrical current of the current-based clock signal in response to the received voltage-based input clock signal while keeping a voltage of the current-based clock signal substantially constant.

30. The wireless transceiver of claim 29, wherein:
    the driver circuit is operable to receive the voltage-based input clock signal from an oscillator.

31. The wireless transceiver of claim 29, wherein:
    a frequency of the current-based clock signal is different than a frequency of the voltage-based input clock signal.

32. The wireless transceiver of claim 29, wherein:
    the driver circuit is operable to convert the voltage-based input clock signal into a differential current-based clock signal.

33. The wireless transceiver of claim 29, wherein:
    the driver circuit includes,
        an input section including at least one input transistor; and
        wherein the converter includes at least one conversion transistor.

34. The wireless transceiver of claim 29, further comprising:
    a receiver circuit operable to receive the current-based clock signal and convert the current-based clock signal into a voltage-based output clock signal.

35. The wireless transceiver of claim 34, wherein:
    the is operable to drive a mixer operable to mix the voltage-based output clock signal with an information signal.

36. The wireless transceiver of claim 34, wherein:
    the clock signal conversion circuit is operable to drive a digital circuit with the voltage-based output clock signal, the digital circuit being operable to perform a synchronous operation.

37. The wireless transceiver of claim 34, wherein:
    the driver circuit is included on a first integrated circuit; and
    the receiver circuit is included on a second integrated circuit.

38. The wireless transceiver of claim 34, further comprising:
    an intermediate circuit connected between the driver circuit and the receiver circuit operable to transform the current-based clock signal.

39. The wireless transceiver of claim 38, wherein:
    the intermediate circuit is operable to filter a spurious signal included in the current-based clock signal.

40. The wireless transceiver of claim 38, wherein:
    the intermediate circuit is operable to amplify the current-based clock signal.

41. The wireless transceiver of claim 34, wherein:
    the driver circuit is connected to a plurality of receiver circuits.

42. The wireless transceiver of claim 34, wherein:
    an input impedance of the receiver circuit is low relative to an impedance of a conduit coupling the driver circuit to the receiver circuit.

43. The wireless transceiver of claim 29, wherein:
    the wireless transceiver is compliant with one or more of the Institute of Electrical and Electronics Engineers standards 802.11, 802.11a, 802.11b, 802.11e, 802.11g, 802.11h, 802.11i, 802.11n, and 802.16.

44. A wireless transceiver, comprising:
    means for converting a voltage-based input clock signal into a current-based clock signal, the means for converting substantially varying an electrical current of the current-based clock signal in response to the received voltage-based input clock signal while keeping a voltage of the current-based clock signal substantially constant; and
    means for processing a modulated carrier signal, the means for processing responsive to the current-based clock signal.

45. The wireless transceiver of claim 44, wherein:
    the means for converting receives the voltage-based input clock signal from an oscillator.

46. The wireless transceiver of claim 44, wherein:
    a frequency of the current-based clock signal is different than a frequency of the voltage-based input clock signal.

47. The wireless transceiver of claim 44, wherein:
    the means for converting converts the voltage-based input clock signal into a differential current-based clock signal.

48. The wireless transceiver of claim 44, wherein:
    the means for converting includes,
        input means including at least one input transistor; and
        conversion means including at least one conversion transistor.

49. The wireless transceiver of claim 44, further comprising:
    a receiver circuit comprising:
        means for receiving the current-based clock signal and converting the current-based clock signal into a voltage-based output clock signal.

50. The wireless transceiver of claim 49, further comprising:
   means for mixing the voltage-based output clock signal with an information signal.

51. The wireless transceiver of claim 49, further comprising:
   means for driving a digital circuit with the voltage-based output clock signal, the digital circuit being operable to perform a synchronous operation.

52. The wireless transceiver of claim 49, wherein:
   the means for converting is included on a first integrated circuit; and
   the receiver circuit is included on a second integrated circuit.

53. The wireless transceiver of claim 49, further comprising:
   means for transforming the current-based clock signal, wherein the means for transforming is coupled between the means for converting the voltage-based input clock signal and the receiver circuit.

54. The wireless transceiver of claim 53, wherein:
   the means for transforming filters a spurious signal included in the current-based clock signal.

55. The wireless transceiver of claim 53, wherein:
   the means for transforming amplifies the current-based clock signal.

56. The wireless transceiver of claim 49, wherein:
   the means for converting is connected to a plurality of receiving circuits.

57. The wireless transceiver of claim 49, wherein:
   an input impedance of the receiver circuit is low relative to an impedance of a conduit coupling the means for converting the voltage-based input clock signal to the receiver circuit.

58. The wireless transceiver of claim 44, wherein:
   the wireless transceiver is compliant with one or more of the Institute of Electrical and Electronics Engineers standards 802.11, 802.11a, 802.11b, 802.11e, 802.11g, 802.11h, 802.11i, 802.11n, and 802.16.

59. A method for processing a clock signal, comprising:
   receiving a voltage-based input clock signal; and
   converting the voltage-based input clock signal into a current-based clock signal, an electrical current of the current-based clock signal substantially varying in response to the received voltage-based input clock signal, the current-based clock signal having substantially no voltage variation.

60. The method of claim 59, wherein:
   receiving the voltage-based input clock signal includes receiving the voltage-based input clock signal from an oscillator.

61. The method of claim 59, wherein:
   a frequency of the current-based clock signal is different than a frequency of the voltage-based input clock signal.

62. The method of claim 59, wherein:
   converting includes converting the voltage-based input clock signal into a differential current-based clock signal.

63. The method of claim 59, wherein:
   receiving the voltage-based input clock signal includes receiving the voltage-based input clock signal using an input transistor; and
   converting includes converting using a conversion transistor.

64. The method of claim 59, further comprising:
   receiving the current-based clock signal; and
   converting the current-based clock signal into a voltage-based output clock signal.

65. The method of claim 64, further comprising:
   mixing the voltage-based output clock signal with an information signal.

66. The method of claim 64, further comprising:
   driving a digital circuit with the voltage based output clock signal, the digital circuit performing a synchronous operation.

67. The method of claim 64, wherein:
   receiving the voltage-based input clock signal includes receiving the voltage-based input clock signal using a first integrated circuit; and
   receiving the current-based clock signal includes receiving the current-based clock signal using a second integrated circuit.

68. The method of claim 64, further comprising:
   transforming the current-based clock signal.

69. The method of claim 68, wherein:
   transforming includes filtering a spurious signal included in the current-based clock signal.

70. The method of claim 68, wherein:
   transforming includes amplifying the current-based clock signal.

71. The method of claim 64, wherein:
   receiving the current-based clock signal includes receiving the current-based clock signal at a plurality of locations.

* * * * *